United States Patent [19]
Mandelcorn

[11] Patent Number: 5,124,595
[45] Date of Patent: Jun. 23, 1992

[54] GATE DRIVE BIAS CIRCUIT FOR MOSFET POWER SWITCHES

[76] Inventor: Josh Mandelcorn, 1745 Berkeley St., Santa Monica, Calif. 90404

[21] Appl. No.: 712,571

[22] Filed: Jun. 10, 1991

[51] Int. Cl.$^5$ ................ H03K 17/687; H03K 17/60
[52] U.S. Cl. .................. 307/571; 307/443; 307/572; 307/584; 307/270; 307/253; 307/254
[58] Field of Search .............. 307/443, 571–572, 307/584, 270, 253–254

[56] References Cited

U.S. PATENT DOCUMENTS 4,952,819  8/1990  Herrmann ................ 307/270

FOREIGN PATENT DOCUMENTS 0245617  10/1986  Japan ....................... 307/571

Primary Examiner—Stanley D. Miller
Assistant Examiner—Margaret Rose Wambach

[57] ABSTRACT

A switching circuit for a switched power supply, and the like, which includes a field effect transistor as a power switch. The switching circuit includes a simple circuit for providing gate drive bias for the field effect transistor which forces it to share turn-off voltage with other field effect transistors connected in series with it. The switching circuit also includes a network for generating a negative gate bias for the field effect transistor to speed up switch-off of the transistor.

4 Claims, 3 Drawing Sheets

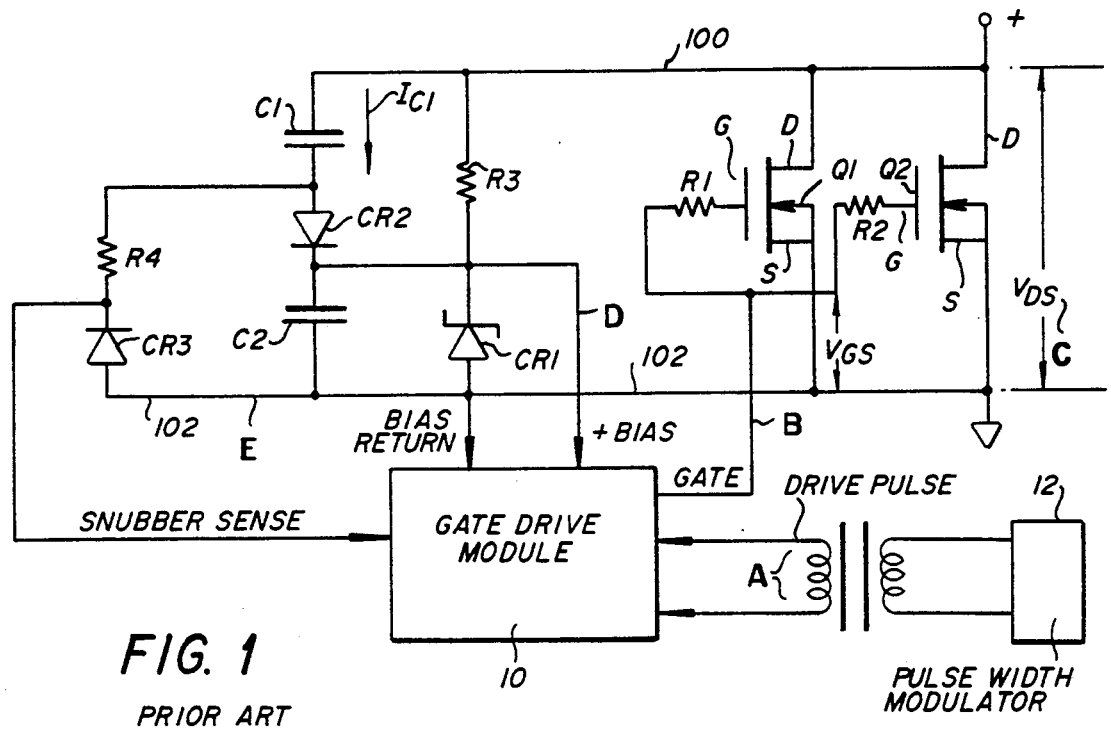
FIG. 1
PRIOR ART
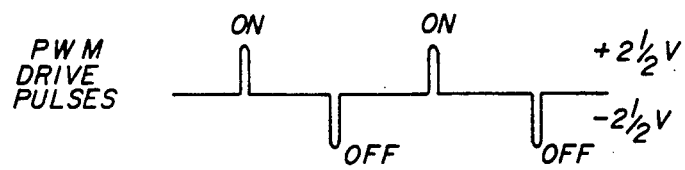
FIG. 2(A) — PWM DRIVE PULSES
FIG. 2(B) — VOLTAGE GATE
FIG. 2(C) — SWITCH DRAIN SOURCE VOLTAGE
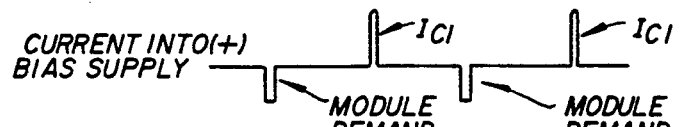
FIG. 2(D) — CURRENT INTO (+) BIAS SUPPLY
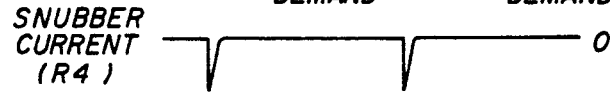
FIG. 2(E) — SNUBBER CURRENT (R4)

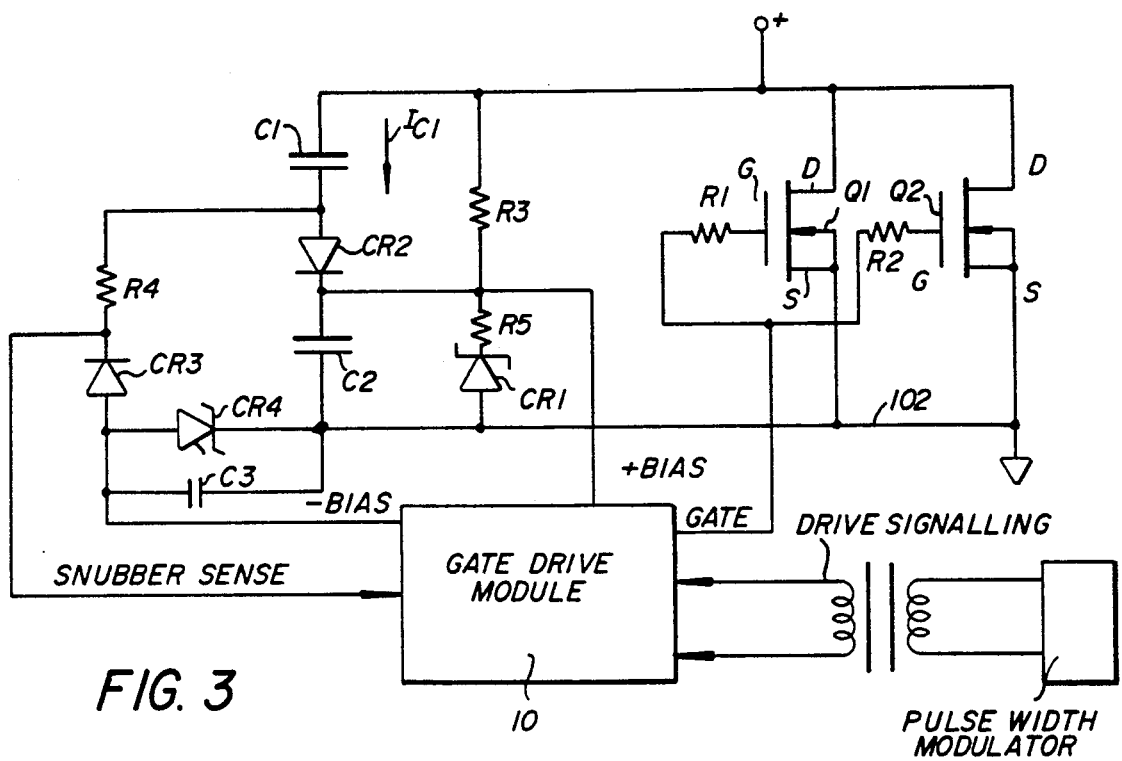
FIG. 3
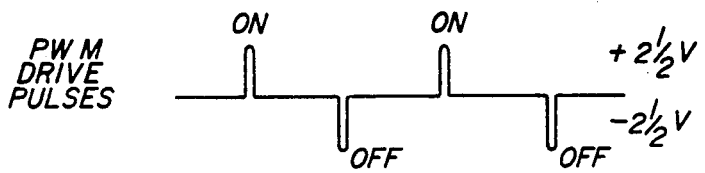
FIG. 4(A) PWM DRIVE PULSES
FIG. 4(B) VOLTAGE GATE
FIG. 4(C) SWITCH DRAIN SOURCE VOLTAGE
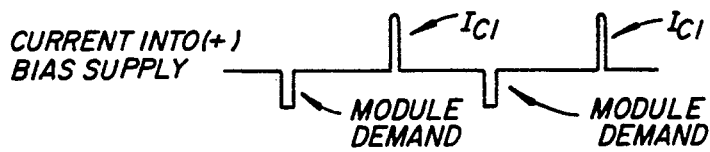
FIG. 4(D) CURRENT INTO (+) BIAS SUPPLY
FIG. 4(E) SNUBBER CURRENT R4

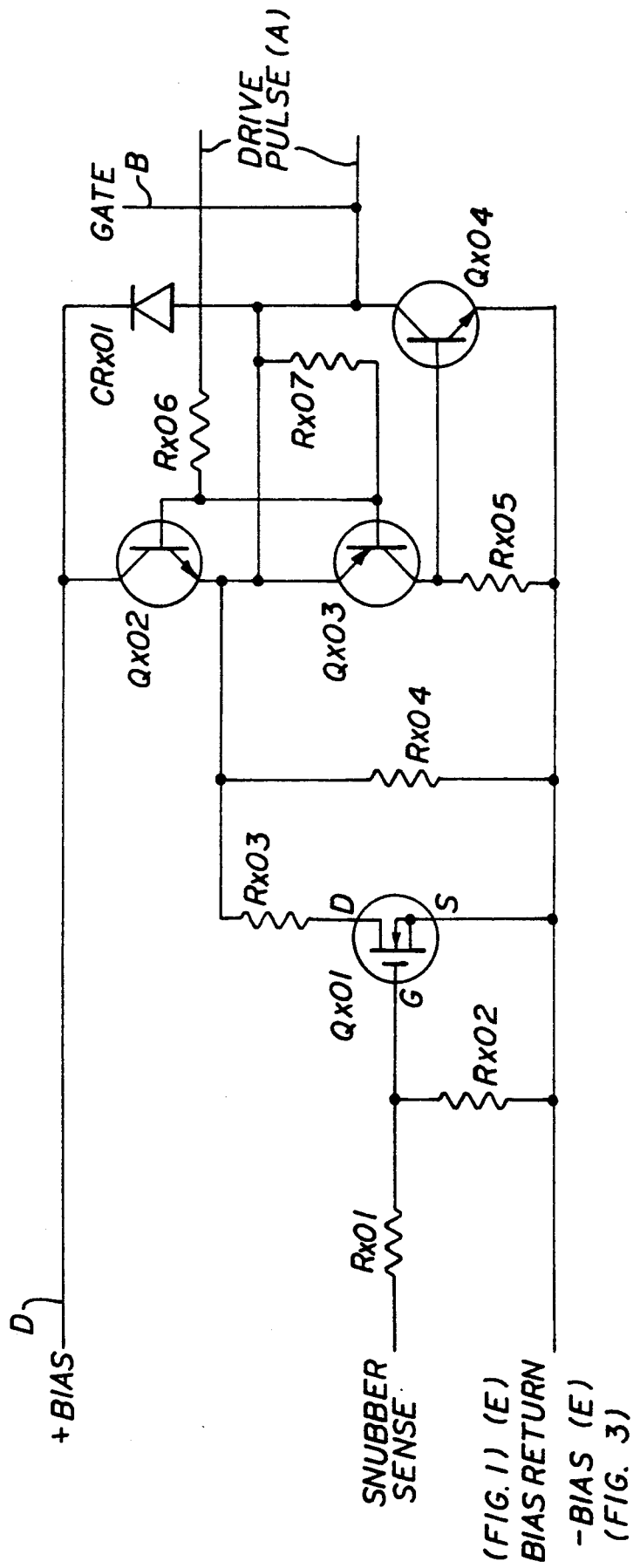
FIG. 5  GATE DRIVE MODULE -10-

GATE DRIVE BIAS CIRCUIT FOR MOSFET POWER SWITCHES

BACKGROUND OF THE INVENTION

Semi-conductor switches, such as power field effect transistors (MOSFETS), are widely used in prior art switched power supplies. Extra auxiliary transformer windings are usually required in such prior art power supplies to assure proper operation of the MOSFET power switches. However, this adds substantial complexity to the auxiliary supply system, especially if negative bias for speeding up the turn-off speed of the MOSFETS is required, and when more than one group of MOSFETS with different source potentials are used. Also, there are no means provided in such prior auxiliary supply systems for forcing the groups of MOSFETS to share the turn-off voltage when the groups are connected in series.

A more recent prior art power supply system uses snubber circuitry in conjunction with the MOSFET power switches to charge the positive gate bias for the MOSFET power switches during each cycle when the MOSFETS are turned off. As is well known, snubbers are normally used to reduce turn-off stresses of controlled semi-conductor switches. The snubber usually includes a capacitor in parallel with the semi-conductor switch to reduce the rate of rise of voltage across the switch when the switch is turned off, absorbing energy that would have had to be dissipated by the switch. Conventional snubber circuitry introduces losses since the charge on the capacitor is dissipated through a resistor to prepare for the next switch turn-off. The semiconductor switch carries the discharge current of the capacitor when the switch is on.

The latter power supply which makes use of snubber circuitry avoids the need for the extra auxiliary transformer windings. However, it does not provide the negative bias needed to speed up turn-on of the MOSFETS, nor does it provide a means to force the MOSFETS to share the turn-off voltage.

Accordingly, an objective of the present invention is to provide an improved and simple circuit for producing gate drive bias for the MOSFET power switches which forces the MOSFETS to share the turn-off voltage when they are connected in series.

Another objective of the invention is to provide such an improved circuit which generates a negative gate bias for the MOSFETS in order to speed up switch-off of the MOSFETS.

BRIEF DESCRIPTION OF THE DRAWINGS

FIG. 1, is a circuit diagram of a prior art switching circuit which includes a pair of MOSFET power switches, and which uses snubber circuitry to control the gate bias of the MOSFETS;

FIG. 2 is a series of wave forms of signals occurring throughout the circuit of FIG. 1;

FIG. 3 is circuit diagram of a switching circuit like FIG. 1, but which includes certain modifications in order to achieve the objectives of the invention;

FIG. 4 is a series of curves illustrating signals occurring throughout the circuit of FIG. 3; and FIG. 5 is a circuit diagram of a gate drive module included in the circuits of FIGS. 1 and 3.

The circuit of FIG. 1 includes a gate drive module represented by a block 10. This module operates in a manner to respond to pulse-width modulated drive pulses (FIG. 2A) from a pulse-width modulator 12 to drive a pair of MOSFETS Q1, Q2. For that purpose, the output of the drive module (FIG. 2B) is introduced to the gate electrodes of the MOSFETS Q1, Q2 through respective 10 Ohm resistors R1 and R2.

The circuit of FIG. 1 includes a positive bias supply Zener Diode CR1, which may be of the type designated 1N4744. Zener Diode CR1 is shunted by a 1 microfarad by-pass capacitor C2. The Zener diode is connected to through a 100 kilo-ohm resistor R3 to a positive potential lead 100 which is connected to the drain electrodes of MOSFETS Q1, Q2. The Zener diode is also connected to a common grounded lead 102 which, in turn, is connected to the drive module 10. The source electrodes of MOSFETS Q1 and Q2 are also connected to common grounded lead 102.

During start-up of the circuit of FIG. 1, capacitor C2 are charged, for example, to 10–15 volts through resistor R3. This is achieved before the MOSFETS Q1, Q2 turn-on because, when the MOSFETS are turned off there is substantial voltage $V_{DS}$ between the leads 100 and 102 (FIG. 2C), and the drive module 10 draws negligible current in the steady turned-off state of the circuit.

The circuit of FIG. 1 also includes a 0.0027 microfarad snubber capacitor C1 connected to lead 100 and to a steering diode CR2. The diode may be of the type designated MUR160. Diode CR2 is connected to a 1 microfarad capacitor C2 which, in turn, is connected to lead 102. The junction of diode CR2 and capacitor C2 is connected to the junction of resistor R3 and Zener diode CR1 and to the gate drive module 10. In this manner, positive bias (FIG. 2D) is supplied to the drive module.

The circuit of FIG. 1 also includes a 100 ohm main snubber resistor R4 which is connected to the junction of capacitor C1 and diode CR2, and which is also connected to lead 102 through a diode CR3. The diode may be of the type designated 1N4937. The cathode of the diode CR3 is connected to the gate drive module 10 to provide a sense point for the drive module.

The positive bias supply capacitor C2 is charged when the MOSFETS Q1, Q2 are turned off. At that time, a current $IC_1$ flows through the snubber capacitor C1 and through the steering diode CR2 into capacitor C2. The direction of the current flow $IC_1$ is shown by the arrow in FIG. 1. Capacitor C1 charges up to substantially the drain-source voltage ($V_{DS}$) of the turned-off power switches Q1, Q2 (FIG. 2—curve C). Accordingly, the total charge available to the positive bias supply (CR2, CR1) is $C1 \cdot V_{DS}$ (off). The average available positive bias current is the aforesaid charge multiplied by the switching frequency or $C1 \, V_{DS} \cdot F$) (FIG. 2—curve D).

The current drawn by the gate drive module 10 is approximately QG= gate charge per power MOSFET x the number (N) of MOSFETS x frequency (QG·N·F) where: QG is given by the manufacturer's data sheets; and N in the circuit of FIG. 1 is 2. To assure adequate positive bias current for the module 10, the average available positive bias current ($C1 \cdot V_{DS} \cdot F$) must be greater than the current drawn by the module (QG·N·F).

As can be seen from the foregoing, increasing frequency (F) does not affect adequacy of the drive because both the supply and the demand are correspondingly increased.

When the MOSFETS power switches Q1, Q2 are turned on, the snubber capacitor C1 discharges through the main snubber resistor R4 and steering diode CR3 (FIG. 2E). The drive module uses the sense point from the cathode of diode CR3 to hold the gate drive module turned-off when the MOSFETS Q1, Q2 are supposed to be off, even when positive excursions occur on the drain electrodes of the MOSFETS.

As shown in FIG. 3, the circuit of FIG. 1 is modified in accordance with the teaching of the present invention by inserting a 1 microfarad capacitor C3, shunted by a Zener diode CR4, in series between the anode of diode CR3 and lead 102; by connecting the anode of the diode CR3 to the gate drive module 10 to supply a negative bias to the gate drive module; and by introducing a 75 ohm resistor R5 between resistor R3 and the cathode of Zener diode CR1. Zener diode CR4 may be of the type designated 1N751C.

In the circuit of FIG. 3, the current flowing through the snubber resistor R4 and through diode CR3 during the turn-on of the MOSFETS power switches Q1, Q2 is caused to flow through capacitor C3 and through Zener diode CR4. This current flow generates a negative DC bias of, for example, 5.1 volts in the gate drive module 10. The steering diode CR3 prevents this negative bias from being drained away when the voltage on capacitor C1 and resistor R4 goes positive. This negative bias approximately doubles the turn-off speed of the MOSFETS power switches Q1 and Q2, which greatly reduces the size of the snubber circuit required for the power switches, and/or reduces the turn-off losses of the power switches. In the circuit under consideration it would be necessary either to double the size of the snubber circuit (raising the rating of resistor R4 to 40 watts), or to nearly double power switch dissipation (from 20 watts per switch to 35 watts per switch) if the negative bias was not employed.

Since the available charge per cycle from the snubber capacitor C1 is the same in the charging mode (turn-off) and discharging mode (turn-on), and the gate module 10 derives the same current from both the positive bias and negative bias; if the drive bias for the positive bias is adequate, it will be sufficient for the negative bias. The only difference is that for a larger gate voltage excursion due to the negative bias, the total QG (Gate charge) is slightly larger. This affects both the positive bias and the negative bias demand equally.

When groups of the MOSFETS power switches are connected in series, adding the resistor R5 in series with the positive gate bias Zener diode CR1 helps force the balance in the turn-off voltages of the MOSFET power switching groups. If one group of MOSFETS turns off sooner than the other, it will hog all the turn-off voltage during this jump start, before the other group turns-off and shares the turn-off until the turn-off clamp is reached. For example, with snubber capacitors of 2700 picofarads and 27 amps of switch current, a 10 nano second jump start translates into a 100 volt imbalance. The group drawing the voltage can be pushed in turn-off toward their break-down voltage resulting in over stress and damage to one or more of the MOSFETS in that group.

The balancing scheme forces a turn-off delay into the MOSFET group that tends to draw the turn-off voltage, thereby forcing the MOSFETS groups to share the turn-off voltage. If one group of MOSFETS tends to draw the turn-off voltage, more current will become available to the positive bias supply of that groups' gate drive since available current is proportional to $V_{DS}$ ($V_{DS}$ C1·F). Since the gate drive demand remains relatively constant, this excessive gate bias supply current will flow through resistor R5 thereby increasing the positive bias voltage. This positive bias voltage will allow the gate electrodes to charge to the higher positive voltage. When it becomes time to turn off the MOSFETS, the additional positive bias will translate into more delay time until the gate electrodes' turn-off threshold is reached, because more capacitive charge needs to be discharged. This added delay counteracts the hogging of that group of MOSFETS, forcing all the MOSFET groups substantially to share the turn-off clamp voltage. In the existing circuit, drain-to-source turn-off voltage imbalances are reduced by more than fifty (50%) percent.

The wave forms shown in FIGS. 4A-4E, are the same as those in FIGS. 2A-2E, with the exception that the gate voltage of curve B is shifted to extend, for example, between −4 and +13 volts, instead of 0 and +15 volts as in the circuit of FIG. 1.

The gate drive module 10 of FIGS. 1 and 3, as is evident from the curves of FIGS. 2A-2E and 4A-4E, is a simple switching circuit and may take any of a variety of well known forms. One possible circuit configuration is shown in FIG. 5.

The circuit of FIG. 5 includes a turn-on transistor switch QX02 and a turn-off Darlington transistor switch QX03, QX04. A FET QX01 is included in a hold-off circuit which prevents transients from turning the switching circuit on during intervals when it is switched off.

The gate drive pulse transformer is connected between the drive pin and the gate pin of the module. A positive going pulse from the transformer turns on transistor QX02 pulling its emitter high toward + bias. The emitter of the transistor is connected to the gate pin which in turn is connected to R1 and R2 and the gates of the main FET's in FIGS. 1 and 3. The gates of the main FET's charge up to + bias through R1 and R2, thereby turning off the FET's. The transistors QX03 and QX04 in the module stay off during this time.

A negative pulse from the gate drive transformer pulls the drive pin negative with respect to the gate pin. This turns QX02 off and QX03 on which, in turn, turns QX04 on. QX04 being turned on pulls the gate pin down toward "bias return" in FIG. 1 and "negative bias" in FIG. 3. This in turn pulls the gate voltage of the main FET's to 0 in FIG. 1 and the negative bias in FIG. 3 through R1 and R2.

The FET QX01 circuit is driven off "snubber sense", and this circuit keeps the main FET's of FIGS. 1 and 2 off after a turn-off has occurred and does not effect turn-off speed. Diode CRX01 protects the gate drive circuit from inductive spikes at the end of the turn-on pulse.

The magnitude of the gate drive resistors R1 and R2 cannot be reduced below a given value in parallel MOSFET operation, without risking a destructive parasitic oscillation. The recommended minimum value for a popular type of MOSFET is 15 ohms. Hence, the speed of the MOSFET turn-off can not be increased simply by reducing the gate drive resistors' value. On a MOSFET, the turn-on and turn-off occur at a given threshold voltage, typically when the gate is biased +4 volts gate-to-source. During the turn-on, a certain amount of charge needs to be injected into the gate, and an equal amount removed during turn-off. For the above mentioned popular MOSFET this is about 50 nano-Coulombs. Now the turn-off speed can be calculated for both the circuit in FIG. 1 and FIG. 3.

In the circuit of FIG. 1, R1 and R2 are pulled down to the negative bias which can be −5 volts, for example. This means a total of 9 volts across R1 and R2. Hence, the turn-off current per transistor is 9 v divided by 15 ohms or 600 mA. The turn-off time is 50 nano Coulombs divided by 600 mA or 83 nano-seconds. This is less than half the time for the circuit in FIG. 1.

During the turn-off transistor, the power transistors see simultaneous high voltages and high currents, and hence high power consumption which is the product of voltage and current.

Therefore, the faster the power transistors go through this mode of high dissipation, the less power dissipation per switching cycle the power transistors will see. In the above example, reducing the turn-off time by more than half also reduces the turn-off power dissipation by more than half.

The invention provides, therefore, a simple and improved circuit for supplying gate drive bias for MOSFET power switches in a switched type of power supply which serves to speed up the turn-off speed of the MOSFETS, and also provides for current sharing in circuits in which more than one group of MOSFETS with different source potentials are used.

It will be appreciated that while a particular embodiment of the invention has been shown and described, modifications may be made. It is intended in the claims to cover all modifications which come within the true spirit and scope of the invention.

I claim:

1. A switching circuit for a switched power supply, and the like, comprising: at least one field effect transistor having drain, source and gate electrodes, and constituting a power switch; a gate drive module having input terminals coupled to a source of drive signals, and having an output terminal connected to said gate electrode for causing said field effect transistor to turn on and off; a first bias supply network connected across said drain and source electrodes and responsive to a charging current when said field effect transistor is turned off for supplying a positive bias to said gate drive module; a second bias supply network connected across said drain and source electrodes and responsive to a charging current when said field effect transistor is turned on for supplying a negative bias to said gate drive module; and a snubber network which in turn includes a snubber capacitor connected to said drain electrode, said snubber capacitor being included in both said first and second bias supply networks, in which said snubber network includes a snubber resistor series-connected with said snubber capacitor, and said second bias supply network includes a steering diode and a Zener diode series-connected between said snubber resistor and said source electrode, and a second capacitor shunted across said Zener diode.

2. The switching circuit defined in claim 1, in which said first bias supply network includes a second steering diode connected to said snubber capacitor, a third capacitor connected between said steering diode and said source electrode, and a second Zener diode shunted across said third capacitor.

3. The switching circuit defined in claim 2, and which includes a first resistor connected across said snubber capacitor and said second steering diode.

4. The switching circuit defined in claim 3, and which includes a second resistor series connected with said first resistor and said second Zener diode.

* * * * *